United States Patent [19]

Lagendijk et al.

[11] Patent Number: 5,599,425
[45] Date of Patent: Feb. 4, 1997

[54] PREDECOMPOSITION OF ORGANIC CHLORIDES FOR SILICON PROCESSING

[75] Inventors: André Lagendijk, Oceanside, Calif.; Damon K. DeBusk, Austin, Tex.

[73] Assignees: Air Products and Chemicals, Inc., Allentown, Pa.; Advanced Micro Devices, Austin, Tex.

[21] Appl. No.: 384,087

[22] Filed: Feb. 6, 1995

[51] Int. Cl.$^6$ ................................................. H01L 21/306
[52] U.S. Cl. .................... 156/646.1; 156/662.1; 134/1; 134/1.1; 134/1.2; 437/225; 437/239; 437/946
[58] Field of Search ................ 156/646.1, 662.1; 134/1.1, 1.2, 1; 148/17; 437/69, 983, 946, 225, 239

[56] References Cited

U.S. PATENT DOCUMENTS

| | | | |
|---|---|---|---|
| 3,795,557 | 3/1974 | Jacob | 156/662.1 |
| 3,837,905 | 9/1974 | Hile et al. | 437/946 |
| 4,789,426 | 12/1988 | Pipkin | 156/662.1 |
| 5,288,662 | 2/1994 | Lagendijk et al. | 437/239 |
| 5,298,075 | 3/1994 | Lagendijk et al. | 134/2 |

*Primary Examiner*—Lee C. Wright
*Attorney, Agent, or Firm*—Geoffrey L. Chase

[57] ABSTRACT

A process for the use of organic chlorides having the general formula $C_xH_yCl_y$, $C_zCl_s$, $C_rO_uCl_{2(r-u+1)}$, $C_rO_uCl_{r-u+1}H_{r-u+1}$, wherein $x=1-10$, more preferably 1–6; $y=x+1$, $x$ or $x-1$; $z=1-10$, more preferably 1–6; $s=2(x+1, x$ or $x-1)$, $r=1-10$, more preferably 2–4; $u=1, 2$ and up to $r$, as precursors for decomposition to chlorine and oxygen-containing reactive reagents for subsequent use for vapor cleaning of silicon, thermal oxidation of silicon in a range of 200° C.–1200° C., rapid thermal oxidation of silicon and silicon polishing or etching.

17 Claims, No Drawings

PREDECOMPOSITION OF ORGANIC CHLORIDES FOR SILICON PROCESSING

TECHNICAL FIELD OF THE INVENTION

The present invention is directed to the predecomposition of various organic chlorides with oxygen at elevated temperatures to provide chlorine and oxygen-containing reagents for subsequent reaction with silicon-containing substrates.

BACKGROUND OF THE INVENTION

High purity hydrogen chloride, HCl, gas is used for several process steps of semiconductor device manufacture. The HCl gas is difficult to deliver in high purity at the point of use and the cost of ownership of the safe gaseous delivery system is high. Liquid in-situ chloride generators, such as organic chlorides have been used as substitutes for HCl (U.S. Pat. Nos. 5,288,662 and 5,298,075). The conversion to inorganic chloride takes place inside of the reaction chamber, where oxidation of the organic chloride takes place: $C_xH_yCl_y + xO_2 \rightarrow xCO_2 + y\ HCl$, where x and y are typically 2, 3 or 4.

Incomplete combustion will result in partially oxidized carbonaceous products, which are detrimental. Thus the oxidation of the organic chlorides must be completed prior to exposure of the semiconductor. For each organic chloride a minimum time at temperature is required and the application of an organic chloride as an HCl or chlorine ($Cl_2$) source is heretofore restricted to silicon oxidation processes carried out in long residence time reactor chambers, held at temperatures of 800° C. or higher.

Organic chlorides typically are not used as HCl and chlorine sources in processes carried out at temperatures below 800° C. or in rapid thermal reactors.

SUMMARY OF THE INVENTION

It has been discovered that organic chlorides of the general formula $C_xH_yCl_y$, $C_zCl_s$, $C_rO_uCl_{2(r-u+1)}$, $C_rO_uCl_{r-u+1}H_{r-u+1}$, wherein x=1–10, more preferably 1–6; y=x+1, x or x–1; z=1–10, more preferably 1–6; s=2(x+1 or x or x–1); r=1–10, more preferably 2–4; u=1,2 and up to r, can be used as HCl and chlorine sources for a variety of semiconductor processes, carried out over a wide temperature range. The organic chloride is quantitatively converted to $CO_2$, HCl and $Cl_2$ in a dedicated external chamber carefully selected to fulfill the requirements for complete combustion. The use of a pre-reactor allows for semiconductor process steps carried out in the range of 200°–800° C. in the presence of HCl and $Cl_2$, such as vapor cleaning and thin thermal oxide formation. Chlorinated rapid thermal oxidation and polishing/etching of silicon can also be done by pre-oxidation of an organic chloride in the external chamber.

DETAILED DESCRIPTION OF THE INVENTION

In the search for hydrogen chloride and chlorine substitutes, we discovered that organic chlorides having the general formula $C_xH_yCl_y$, $C_zCl_s$, $C_rO_uCl_{2(r-u+1)}$, $C_rO_uCl_{r-u+1}H_{r-u+1}$, wherein x=1–10, more preferably 1–6; y=x+1, x or x'more preferably 1–6; s=2(x+1, x or x–1); r=1–10, more preferably 2–4; u=1,2 an to r, can be used by the application of a pre-combustion chamber or decomposition reaction zone where the organic chloride is reacted with oxygen at at least the organic chloride's decomposition temperature to produce chlorine and oxygen-containing reactive reagents, such as hydrogen chloride, chlorine, oxygen, as well as additional reaction products of water and carbon dioxide. For the present invention, chlorine-containing reactive reagent shall mean chlorides and chlorine. Since complete combustion is required, sufficient oxidant, at least stoichiometric, preferably exceeding stoichiometry must be added. The rate of combustion is specific for each compound used. For instance for a one second residence time at temperature, trans-dichloroethylene requires 700° C., while 1,1,1-trichloroethane needs 800° C. and methylene chloride 900° C., as per U.S. Pat. No. 5,288,662 and 5,298,075.

The class of chlorine precursors represented by the formula, $C_xH_yCl_y$, is exemplified by methylene chloride, trans-dichloroethylene and 1,1,1 trichloroethane. The class of chlorine precursors represented by the formula, $C_zCl_s$, is exemplified by perchloroethylene and carbontetrachloride. The class of chlorine precursors represented by the formula, $C_rO_uCl_{2(r-u+1)}$, is exemplified by oxalylchloride and trichloroacetylchloride. The class of chlorine precursors represented by the formula, $C_rO_uCl_{r-u+1}H_{r-u+1}$, is exemplified by trichloroacetone.

The processes that the present invention is amenable to include; vapor cleaning of silicon, thermal oxidation of silicon in a range of 200°–1200° C., rapid thermal oxidation of silicon and silicon polishing or etching. Vapor cleaning is a process in which a surface is exposed to a reactive vapor with removal of impurities, such as the vapor cleaning of silicon with oxygen and chlorine species. Thermal oxidation is a process in Which a silicon substrate is thermally heated and exposed to an oxidant. The result is surface oxidation. Rapid thermal oxidation is a process in which the thermal oxidation takes place during a short period of high temperature exposure. Typically, the process is carried out within seconds. Polishing is a process in which the surface roughness is decreased by preferential removal of protrusions, such as silicon surfaces. Etching is a process in which the surface of a substrate is removed by a chemical reaction, such as the etching of silicon by agents which are amenable to etching silicon. These( reactions are performed in a main reaction zone, which is distinct from the decomposition reaction zone at least in temperature, if not in being physically discrete, although preferably near or adjacent the main reaction zone. The importance of the distinct decomposition reaction zone and the main reaction zone is that the decomposition temperature of the chosen organic chloride may be different than the temperature of the reaction using the chlorine and oxygen-containing reactive reagents on the silicon substrate being processed. Typically, the decomposition temperature is higher than the temperature to which the silicon is desired to be exposed. The present invention provides the flexibility to allow the use of these on-site or in-situ sources of chlorine and oxygen-containing reactive reagents to avoid transportation problems or corrosive agents and their purity problems, while still allowing the independent selection of reaction temperatures in the main reaction zone where the silicon substrate is being processed.

In a typical process, 150 standard cubic centimeter per minute, sccm, transdichloroethylene was bubbled with an inert and mixed with 500 sccm oxygen. The mixture was introduced into a heated quartz coil, serving as a decomposition reaction zone. The effluent of the coil was forwarded to a quartz reaction chamber, in which the flow of gases, which chamber serves as a main reaction zone. The quartz chamber was independently heated and contained silicon wafers. Several process steps were executed.

EXAMPLE 1

A silicon wafer pre-contaminated with $1.8 \times 10^{15}$ iron atoms/cm$^2$ was exposed to the chlorinated gas mixture generated from trans-dichloroethylene. The treatment lasted 30 minutes at 600° C.

Re-analysis of the wafer surface by TXRF (Total X-ray Fluorescence) showed that the iron content had decreased four orders of magnitude, namely to $10^{11}$ atoms Fe/cm$^2$. Time of Flight Secondary Ion Mass Spectrometry proved the absence of carbon on the wafer.

Conclusion: The low temperature vapor cleaning of silicon wafers with HCl and Cl$_2$ generated from trans-dichloroethylene, is highly effective.

EXAMPLE 2

Thermal oxidation of silicon wafers in the presence of HCl and Cl$_2$ generated from trans-dichloroethylene was executed at 650° C. and 800° C. during a period of 30 minutes. The resulting oxides were 22 and 42 Å thick.

Conclusion: Thin thermal silicon oxides can be made in the presence of gettering agents, such as HCl and Cl$_2$.

EXAMPLE 3

Silicon wafers were exposed for 30 minutes at 600° C., 650° C. and 800° C. to the HCl, Cl$_2$ mixture generated from trans-dichloroethylene. The oxide was stripped off the surface and the microroughness of the remaining substrate measured by atomic force microscopy. Similar wafers were treated identically, except for the addition of HCl gas originating from bottled gas. Similar wafers received only the thermal treatment without addition of reactive chlorine-containing gases. The value RMS is root means square and is a recognized measure of roughness.
Results:

| Process | RMS in Å |
|---|---|
| trans-DCE | 1.5–2 |
| HCl | 4–12 |
| No Cl | 5–10 |

Conclusion:

The precombusted trans-dichloroethylene has a polishing effect, which appears to strongly favor use of transdichloroethylene. The bottled gas HCl treatment roughens the surface to an unacceptable extent. The present invention has been set forth with regard to several preferred embodiments, however the full scope of the present invention should be ascertained from the claims which follow.

We claim:

1. A process for reaction of a silicon-containing substrate with chlorine and oxygen-containing reactive reagents selected from the group consisting of hydrogen chloride, chlorine, oxygen and mixtures thereof in a main reaction zone, comprising the steps of:

(a) providing a chlorine precursor selected from the group consisting of $C_xH_yCl_y$, $C_zCl_s$, $C_rO_uCl_{2(r-u+1)}$, $C_rO_uCl_{r-u+1}H_{r-u+1}$ and mixtures thereof, wherein x=1–10; y=x+1, x or x−1; z=1–10; s=2(x+1, x or x−1); r=1–10; u=1,2 and up to r;

(b) providing at least a stoichiometric amount of a source of oxygen to react with said chlorine precursor;

(c) reacting said chlorine precursor and said source of oxygen at least the decomposition temperature of said chlorine precursor to generate said chlorine and oxygen-containing reactive reagents in a distinct decomposition reaction zone;

(d) delivering said chlorine and oxygen-containing reactive reagents to said main reaction zone;

(e) reacting said chlorine and oxygen-containing reactive reagents with said silicon-containing substrate in said main reaction zone at a temperature independent of the temperature of step (c).

2. The process of claim 1 wherein said reaction of said silicon-containing substrate with chlorine and oxygen-containing reactive reagents is selected from the group consisting of vapor cleaning, thermal oxidation, rapid thermal oxidation and polishing.

3. The process of claim 1 wherein said silicon-containing substrate is silicon.

4. The process of claim 1 wherein said decomposition temperature is at least 700° C.

5. The process of claim 1 wherein said temperature of step (e) is in the range of approximately 200° C. to 1200° C.

6. The process of claim 1 wherein said chlorine precursor is trans-dichloroethylene.

7. The process of claim 1 wherein said chlorine precursor is cis-dichloroethylene.

8. The process of claim 1 wherein said chlorine precursor is 1,1-dichloroethylene.

9. The process of claim 1 wherein said chlorine precursor is 1,1,1-trichloroethane.

10. The process of claim 1 wherein said chlorine precursor is methylene chloride.

11. The process of claim 1 wherein said chlorine precursor is carbontetrachloride.

12. The process of claim 1 wherein said chlorine precursor is perchloroethylene.

13. The process of claim 1 wherein said chlorine precursor is selected from the group consisting of trans-dichloroethylene, cis-dichloroethylene, 1,1-dichloroethylene, 1,1,1-trichloroethane, methylene chloride, carbontetrachloride, perchloroethylene and mixtures thereof.

14. The process of claim 1 wherein x=1–4.

15. The process of claim 1 wherein z=1–4.

16. The process of claim 1 wherein s=1–4.

17. The process of claim 1 wherein r=1–4.

* * * * *